(12) United States Patent
Cheng et al.

(10) Patent No.: US 11,803,088 B2
(45) Date of Patent: Oct. 31, 2023

(54) ELECTRODE STRUCTURE, CAPACITOR, GOA CIRCUIT, ARRAY SUBSTRATE, DISPLAY PANEL AND DISPLAY DEVICE

(71) Applicants: Beijing BOE Technology Development Co., Ltd., Beijing (CN); BOE Technology Group Co., Ltd., Beijing (CN)

(72) Inventors: Hongfei Cheng, Beijing (CN); Jianbo Xian, Beijing (CN); Hui Li, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 482 days.

(21) Appl. No.: 17/046,820

(22) PCT Filed: Mar. 26, 2020

(86) PCT No.: PCT/CN2020/081513
§ 371 (c)(1),
(2) Date: Oct. 12, 2020

(87) PCT Pub. No.: WO2020/253302
PCT Pub. Date: Dec. 24, 2020

(65) Prior Publication Data
US 2023/0122041 A1 Apr. 20, 2023

(30) Foreign Application Priority Data
Jun. 18, 2019 (CN) .......................... 201920918616.5

(51) Int. Cl.
*G02F 1/1362* (2006.01)
*G02F 1/1343* (2006.01)
*H01L 27/12* (2006.01)

(52) U.S. Cl.
CPC ...... *G02F 1/136204* (2013.01); *G02F 1/1343* (2013.01); *H01L 27/1222* (2013.01)

(58) Field of Classification Search
CPC .......... G02F 1/136204; G02F 2202/22; G02F 1/136213; H01L 27/1255
See application file for complete search history.

(56) References Cited

U.S. PATENT DOCUMENTS

2006/0012729 A1* 1/2006 Tanaka ............... G02F 1/136259
349/54
2007/0194317 A1* 8/2007 Lim .................. G02F 1/136204
257/E27.113

(Continued)

FOREIGN PATENT DOCUMENTS

CN 1379468 A 11/2002
CN 101059948 A 10/2007

(Continued)

*Primary Examiner* — Jia X Pan
(74) *Attorney, Agent, or Firm* — IPRO, PLLC

(57) ABSTRACT

The disclosure relates to the technical field of display, and discloses an electrode structure, a capacitor, a GOA circuit, an array substrate, a display panel and a display device, wherein the electrode structure includes a body and a first opening formed in the body, the first opening has a half-enclosed shape, and a part, enclosed by the first opening, of the body has a tip structure. Each of the capacitor, the GOA circuit, the array substrate, the display panel and the display device includes the above-mentioned electrode structure.

16 Claims, 6 Drawing Sheets

(56) References Cited

U.S. PATENT DOCUMENTS

2017/0221417 A1* 8/2017 Jung .................. G09G 3/20
2018/0210276 A1* 7/2018 Cheng ............... G02F 1/133514

FOREIGN PATENT DOCUMENTS

| CN | 202815800 U | 3/2013 |
| CN | 106526929 A | 3/2017 |
| CN | 108628041 A | 10/2018 |
| CN | 209858910 U | 12/2019 |
| JP | H10177357 A | 6/1998 |

* cited by examiner

ELECTRODE STRUCTURE, CAPACITOR, GOA CIRCUIT, ARRAY SUBSTRATE, DISPLAY PANEL AND DISPLAY DEVICE

CROSS REFERENCE TO RELATED APPLICATIONS

The present disclosure is a US National Stage of International Application No. PCT/CN2020/081513, filed on Mar. 26, 2020, which claims priority from a Chinese patent application named "Electrode Layer, Capacitor, GOA Circuit, Array Substrate, Display Panel and Display Device" filed to CNIPA on Jun. 18, 2019, with application No. 201920918616.5, the contents of which are entirely incorporated herein by reference.

FIELD

The present disclosure relates to the technical field of display, and particularly relates to an electrode structure, a capacitor, a GOA (Gate on Array) circuit, an array substrate, a display panel and a display device.

BACKGROUND

Electric discharge due to static electricity tends to cause function damages to electric devices and circuits, thus causing electronic products to be defective or unable to use. In current electronic equipment, the integration of the circuits become higher and the densities of the devices become larger, raising higher challenges against electrostatic protection. Therefore, how to provide good electrostatic protection is always one of the key research topics in the electronic product field.

SUMMARY

The present disclosure provides an electrode structure, including: a body and a first opening running through the body along a direction of a thickness of the body, wherein the first opening has a half-enclosed shape in a cross section parallel to a plane where the body is located, and a part, enclosed by the first opening, of the body has a tip structure.

Optionally, in the above-mentioned electrode structure provided by an embodiment of the present disclosure, the tip structure has a width smaller than 10 µm, and has a length over 3 times of the width.

Optionally, in the above-mentioned electrode structure provided by an embodiment of the present disclosure, the first opening is a U-shaped opening, and a part, enclosed by the U-shaped opening, of the body has a tip structure arranged toward a bottom of the U-shaped opening.

Optionally, in the above-mentioned electrode structure provided by an embodiment of the embodiment, the U-shaped opening is arranged close to an edge of the body, and the opening orientation of the U-shaped opening is the same as an extending direction of the edge close to the U-shaped opening.

Optionally, in the above-mentioned electrode structure provided by an embodiment of the present disclosure, two top ends of the U-shaped opening are circular arcs.

Optionally, in the above-mentioned electrode structure provided by an embodiment of the present disclosure, a bulge part protruding toward the tip structure is arranged at a part, opposite to the tip structure, of the body.

Optionally, in the above-mentioned electrode structure provided by an embodiment of the present disclosure, a distance between the tip structure and the bulge part is 4 µm-25 µm.

An embodiment of the present disclosure further provides a capacitor, including an upper electrode and a lower electrode which are arranged oppositely; at least one of the upper electrode and the lower electrode has the electrode structure according to any one of the above-mentioned embodiments.

An embodiment further provides a GOA circuit, including a capacitor and a thin film transistor (TFT) circuit, wherein the upper electrode and the lower electrode of the capacitor are electrically connected with the TFT circuit respectively; the upper electrode of the capacitor has the electrode structure according to any one of the above-mentioned embodiments.

Optionally, in the above-mentioned GOA circuit provided by an embodiment of the present disclosure, the capacitor further includes a semiconductor layer located between the upper electrode and the lower electrode, the semiconductor layer is adjacent to the upper electrode, and the semiconductor layer is exposed under the first opening.

Optionally, in the above-mentioned GOA circuit provided by an embodiment of the present disclosure, the first opening included in the upper electrode is a U-shaped opening, and second openings are respectively formed in two top ends of the U-shaped opening.

Optionally, in the above-mentioned GOA circuit provided by an embodiment of the present disclosure, the TFT circuit includes a TFT, the lower electrode of the capacitor and a gate electrode of the TFT are electrically connected and are prepared on a same layer, and the upper electrode of the capacitor and a drain electrode of the TFT are electrically connected and prepared on a same layer; and the semiconductor layer of the capacitor and an active layer of the TFT are prepared on a same layer.

Optionally, in the above-mentioned GOA circuit provided by an embodiment of the present disclosure, the semiconductor layer includes an a-Si layer and an N+a-Si layer which are overlapped sequentially, the N+a-Si layer is adjacent to the upper electrode, a third opening is formed in the N+a-Si layer, and a projection of the third opening on the lower electrode overlaps with a projection of the first opening on the lower electrode.

Optionally, in the above-mentioned GOA circuit provided by an embodiment of the present disclosure, the upper electrode includes at least one first opening formed on a side edge close to the TFT.

An embodiment of the present disclosure further provides an array substrate, including the GOA circuit according to any one of the above-mentioned embodiments, and a gate line corresponding to the GOA circuit, wherein the gate line is electrically connected with the upper electrode of the capacitor in the GOA circuit.

Optionally, in the above-mentioned array substrate provided by an embodiment of the present disclosure, the upper electrode includes at least one first opening formed on a side edge close to the gate line.

An embodiment of the present disclosure further provides a display panel, including the array substrate according to any one of the above-mentioned embodiments.

An embodiment of the present disclosure further provides a display device, including the display panel according to the above-mentioned embodiment.

DETAILED DESCRIPTION OF THE EMBODIMENTS

Generally, a metal electrode structure or an electrode plate structure in a circuit structure easily collects electric charge and discharges to the surrounding area, easily causing damages of surrounding electric devices and thus causing function damages of the entire circuit. In some cases, electronic products may consequently be defective or unable to use. In view of this, the present disclosure provides an electrode structure, a capacitor, a GOA circuit, an array substrate, a display panel and a display device, so as to improve an electrostatic protection effect, and increase a yield rate and prolong service lives of electronic products.

In conjunction with the accompanying drawings in the embodiments of the present disclosure, the technical schemes of the embodiments of the present disclosure will be described clearly and completely hereinafter. Apparently, the embodiments described are only a part of the embodiments of the present disclosure, rather than all of the embodiments. Based on the embodiments of the present disclosure, all other embodiments obtained by those of ordinary skill in the art without creative efforts are within the scope of protection of the present disclosure.

Figure 1:
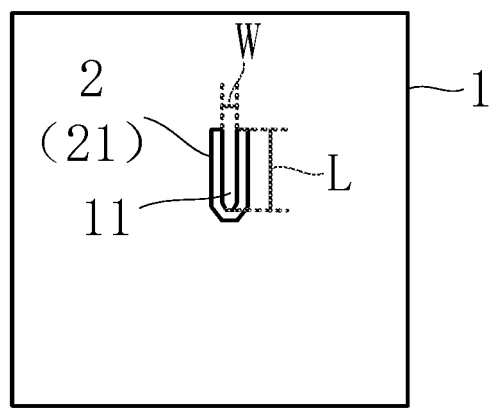
FIG. 1 is a structural schematic diagram of an electrode structure provided by an embodiment of the present disclosure.

As shown in FIG. 1, an embodiment of the present disclosure provides an electrode structure, including a body 1 and a first opening 2 running through the body 1 along a direction of a thickness of the body 1, wherein the first opening 2 has a half-enclosed shape in a cross section parallel to a plane where the body 1 is located, and a part, enclosed by the first opening 2, of the body 1 has a tip structure 11. Specifically, the "tip structure" refers to a protruding end where electric charge easily accumulates and point discharge easily occurs; and exemplarily, the end has a width W smaller than 10 um, and has a length L over 3 times of the width W.

The body 1 of the above-mentioned electrode structure is divided into two parts by the first opening 2, i.e., a part inside the first opening 2 and a part outside the first opening 2, wherein the part inside the first opening 2 has the tip structure 11, and. When electrostatic charge is generated inside the body 1 of the electrode structure, the tip structure 11 inside the first opening 2 easily collects electrostatic charge, and when the electrostatic charge accumulates to a certain extent, the tip structure 11 easily forms a discharge path with the part, opposite to the tip structure (the part outside the first opening 2), of the body 1, thus releasing the electrostatic charge to the part, opposite to the tip structure (the part outside the first opening 2), of the body 1. In this way, the electrostatic charge accumulated in the body 1 of the electrode structure can be discharged inside the electrode structure, avoiding electrostatic charge accumulation in the electrode structure and preventing the electrode structure from discharging to surrounding circuits, to avoid damaging the surrounding circuits. In addition, the tip structure 11 formed in the first opening 2 allows the electrostatic charge accumulated in the body 1 of the electrode structure to be discharged to specific positions and directions, realizing control on discharge positions and directions, further improving an electrostatic protection effect and avoiding damaging the surrounding circuits.

Optionally, in the above-mentioned electrode structure provided by an embodiment of the present disclosure, as shown in FIGS. 1 to 6, the first opening 2 can be a U-shaped opening 21; the part, enclosed by the U-shaped opening 21, of the body 1 is strip shaped; and the part, enclosed by the U-shaped opening 21, of the body 1 has the tip structure 11 arranged toward a bottom of the U-shaped opening 21.

Figure 2:
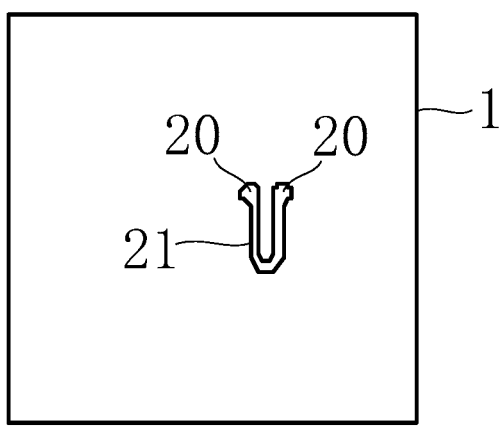
FIG. 2 is a structural schematic diagram of another electrode structure provided by an embodiment of the present disclosure.

Optionally, in the above-mentioned electrode structure provided by an embodiment of the present disclosure, as shown in FIG. 2, two top ends 20 of the U-shaped opening 21 can be circular arcs.

Specifically, the two top ends 20 of the U-shaped opening 21 are circular arcs without sharp parts, thus avoiding the electrostatic charge from being accumulated and released at the two top ends 20, and allowing more electrostatic charge to be accumulated at the tip structure 11 of the U-shaped opening 21, to easily realize electrostatic discharge at the tip structure 11 and thus better control the discharge positions and directions.

Figure 3:
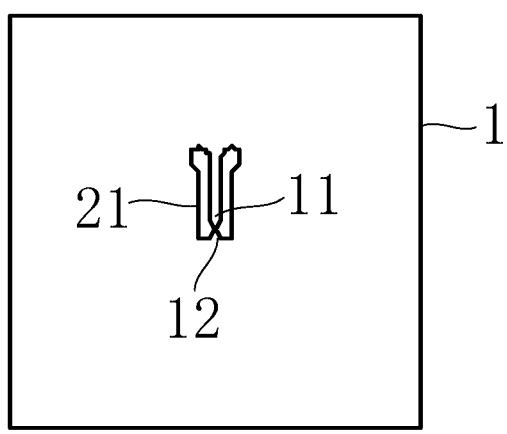
FIG. 3 is a structural schematic diagram of another electrode structure provided by an embodiment of the present disclosure.

Optionally, in the above-mentioned electrode structure provided by an embodiment of the present disclosure, as shown in FIG. 3, a bulge part 12 protruding toward the tip structure 11 is arranged at the part, opposite to the tip structure 11, of the body 1. The bulge part 12 can reduce a gap between the tip structure 11 and the part, opposite to the tip structure 11, of the body 1, so as to reduce the distance of the discharge path of the tip structure 11 and thus allow discharge to easily occur at the tip structure 11.

Optionally, in the above-mentioned electrode structure provided by an embodiment of the present disclosure, a distance between the tip structure 11 and the bulge part 12 is 4 μm-25 μm, namely, a minimum distance of the discharge path can be 4 μm.

Figure 4:
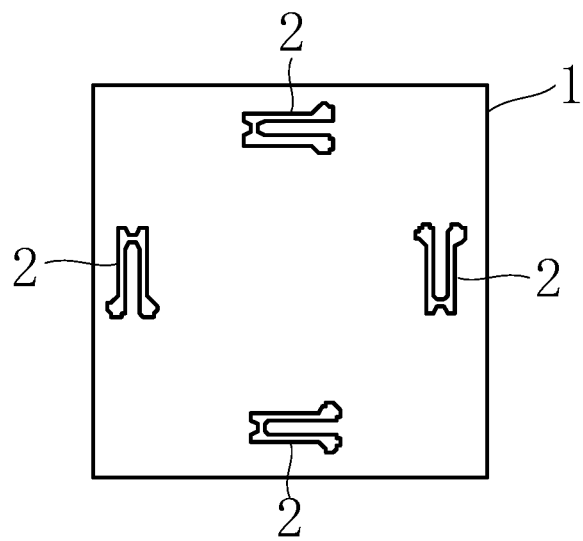
FIG. 4 is a structural schematic diagram of another electrode structure provided by an embodiment of the present disclosure.

Optionally, in the above-mentioned electrode structure provided by an embodiment of the present disclosure, as shown in FIG. 4, the first opening 2 can be formed close to an edge of the body 1, and a discharge direction of the tip structure 11 is the same as an extending direction of the edge close to the first opening 2.

Specifically, the first opening 2 is formed close to the edge of the body 1 and discharges along the edge of the body 1, thus effectively avoiding accumulation of electrostatic charge at the edge of the body 1, preventing the electrostatic charge at the edge of the body 1 from being discharged to the surrounding circuits near the edge, and thus providing good protection to the surrounding circuits of the electrode structure.

Figure 5:
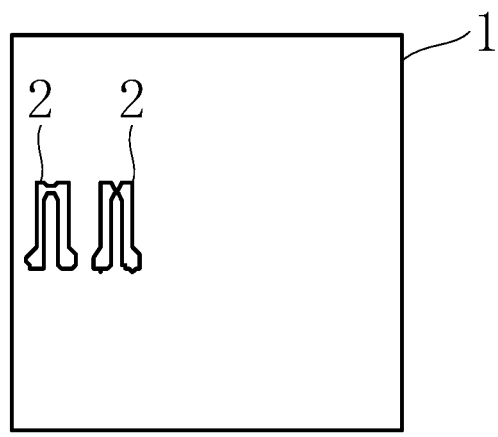
FIG. 5 is the structural schematic diagram of another electrode structure provided by an embodiment of the present disclosure.
Figure 6:
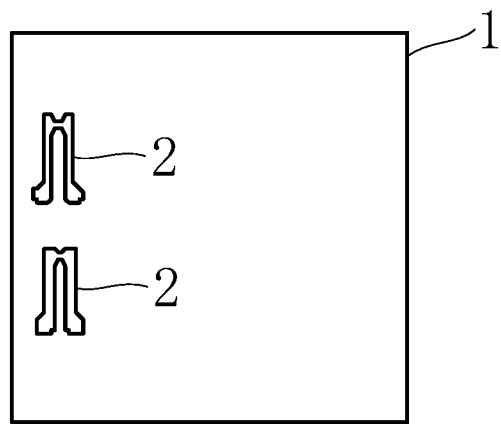
FIG. 6 is the structural schematic diagram of another electrode structure provided by an embodiment of the present disclosure.

Exemplarily, as shown in FIGS. 4 to 6, the first opening 2 is the U-shaped opening 21 which is formed close to the edge of the body 1, and the opening orientation of the U-shaped opening 21 is the same as the extending direction of the edge close to the U-shaped opening 21, namely an extending direction (orientation of the tip structure 11) of a strip-type electrode inside the U-shaped opening 21 is the same as an extending direction of an edge close to the strip-type electrode, and further a discharge direction of the tip structure 11 is the same as the extending direction of the edge, close to the tip structure, of the body 1.

Exemplarily, as shown in FIGS. 4 to 6, the electrode structure provided by an embodiment of the present disclosure can include a plurality of first openings 2 (namely including a plurality of tip structures 11), to enhance an effect of guiding electrostatic discharge. Specifically, the plurality of first openings 2 are formed close to the edges of the body 1, two first openings 2 arranged side by side can be formed near each edge as shown in FIG. 5, or two first openings 2 arranged in series can be formed near each edge as shown in FIG. 6.

Figure 7:
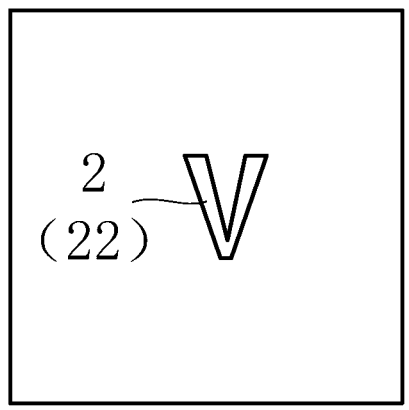
FIG. 7 is the structural diagram of another electrode structure provided by an embodiment of the present disclosure.
Figure 8:
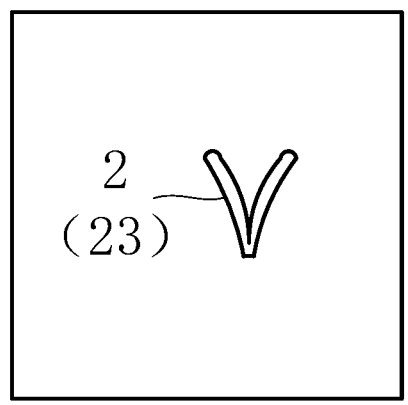
FIG. 8 is the structural schematic diagram of another electrode structure provided by an embodiment of the present disclosure.

Of course, in an embodiment of the present disclosure, the first opening 2 is not limited to the U-shaped opening, but can be a V-shaped opening 22 as shown in FIG. 7 or a V-shaped opening 23 with arc edges as shown in FIG. 8.

Figure 9:
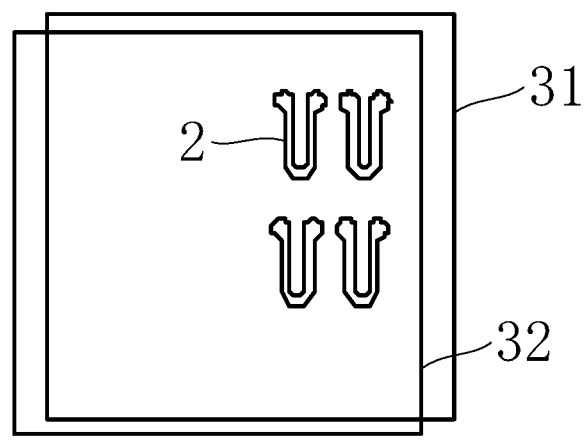
FIG. 9 is the structural schematic diagram of another capacitor provided by an embodiment of the present disclosure.

On the basis of the same inventive concept, an embodiment of the present disclosure also provides a capacitor, as shown in FIG. 9, including an upper electrode 32 and a lower electrode 31 which are arranged oppositely, wherein at least one of the upper electrode 32 and the lower electrode 31 adopts the electrode structure according to any one of the above-mentioned embodiments, namely at least one of the upper electrode 32 and the lower electrode 31 is provided with the first opening 2.

On the basis of the same inventive concept, an embodiment of the present disclosure also provides an integrated gate driving circuit (GOA circuit 4), as shown in FIGS. 10 to 14, including a capacitor 3 and a thin film transistor circuit (TFT circuit 5), wherein an upper electrode 32 and a lower electrode 31 of the capacitor 3 are electrically connected with the TFT circuit 5 respectively; and at least one of the upper electrode 32 and the lower electrode 31 adopts the electrode structure according to any one of the above-mentioned embodiments.

Optionally, in the above-mentioned GOA circuit provided by an embodiment of the present disclosure, as shown in FIGS. 10 to 14, the upper electrode 32 of the capacitor 3 adopts the electrode structure according to any one of the above-mentioned embodiments, namely, the upper electrode 32 is provided with a first opening 2, so that a tip structure 11 is formed on a body of the upper electrode 32.

Specifically, electrostatic charge more easily accumulates on the upper electrode 32 of the capacitor 3. The tip structure 11 for releasing the electrostatic charge is formed inside the body of the upper electrode 32, so that an electrostatic protection effect of the entire capacitor 3 is promoted, and further, the capacitor 3 is prevented from discharging to surrounding circuits to avoid damaging the surrounding circuits.

Figure 15:
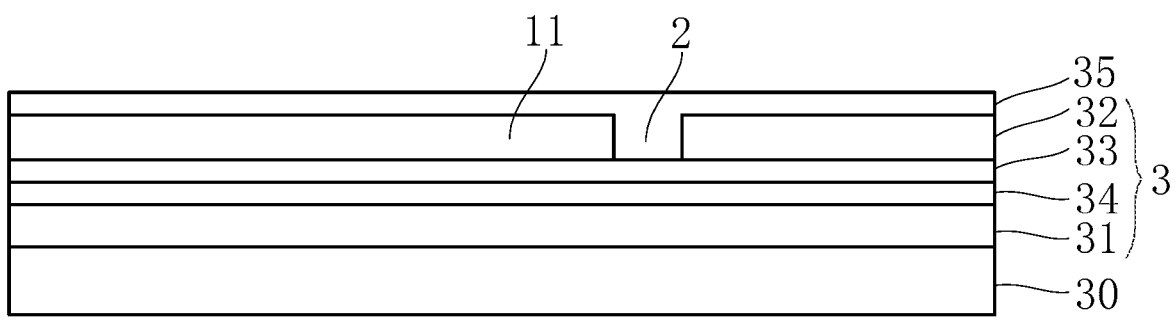
FIG. 15 is a structural schematic diagram of a cross section of the array substrate in FIG. 11 along a direction A-A.

Optionally, in the above-mentioned GOA circuit provided by an embodiment of the present disclosure, as shown in FIG. 15, the capacitor 3 can further include a semiconductor layer 33 located between the upper electrode 32 and the lower electrode 31, the semiconductor layer 33 is adjacent to the upper electrode 32, and the semiconductor layer 33 is exposed under the first opening 2.

Specifically, since the semiconductor layer 33 adjacent to the upper electrode 32 is exposed by the first opening 2 of the upper electrode 32, when the upper electrode 32 generates electrostatic charge, the tip structure 11 located inside the first opening 2 collects the electrostatic charge, and forms a discharge path by using the semiconductor layer 33 exposed by the first opening 2, so that the electrostatic charge is more easily released to the part, opposite to the tip structure 11, of the body of the upper electrode 32, to improve the electrostatic protection effect of the capacitor 3.

Figure 11:
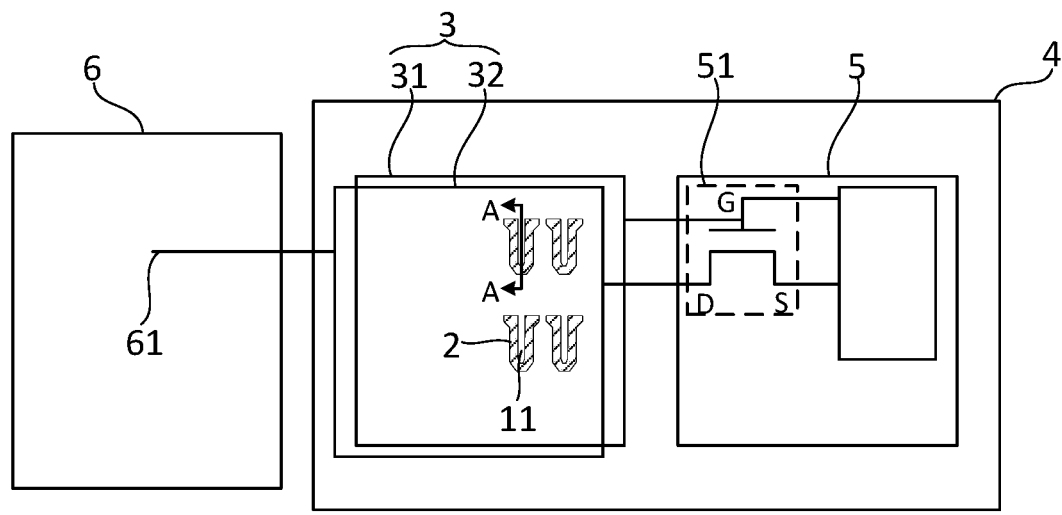
FIG. 11 is a partial structural schematic diagram of another array substrate provided by an embodiment of the present disclosure.

Optionally, in the above-mentioned GOA circuit provided by an embodiment of the present disclosure, as shown in FIG. 11, the TFT circuit 5 includes a TFT 51, the lower electrode 31 of the capacitor 3 is electrically connected with a gate electrode G of the TFT 51, and the upper electrode 32 of the capacitor 3 is electrically connected with a drain electrode D of the TFT 51.

Exemplarily, the lower electrode 31 of the capacitor 3 and a gate electrode G of the TFT 51 can be prepared on a same layer, the upper electrode 32 of the capacitor 3 and a source electrode S and a drain electrode D of the TFT 51 can be prepared on a same layer, and the semiconductor layer 33 of the capacitor 3 and an active layer of the TFT 51 can be prepared on a same layer.

Specifically, as shown in FIG. 15, the capacitor 3 can further include a first insulation layer 34 located between the upper electrode 32 and the lower electrode 31. Exemplarily, the first insulation layer 34 and a gate insulation layer of the TFT 51 can be prepared on a same layer.

Specifically, as shown in FIG. 15, a second insulation layer 35 can further be arranged on the capacitor 3, and the second insulation layer 35 can be prepared on a same layer as a passivation layer of the TFT 51.

Figure 12:
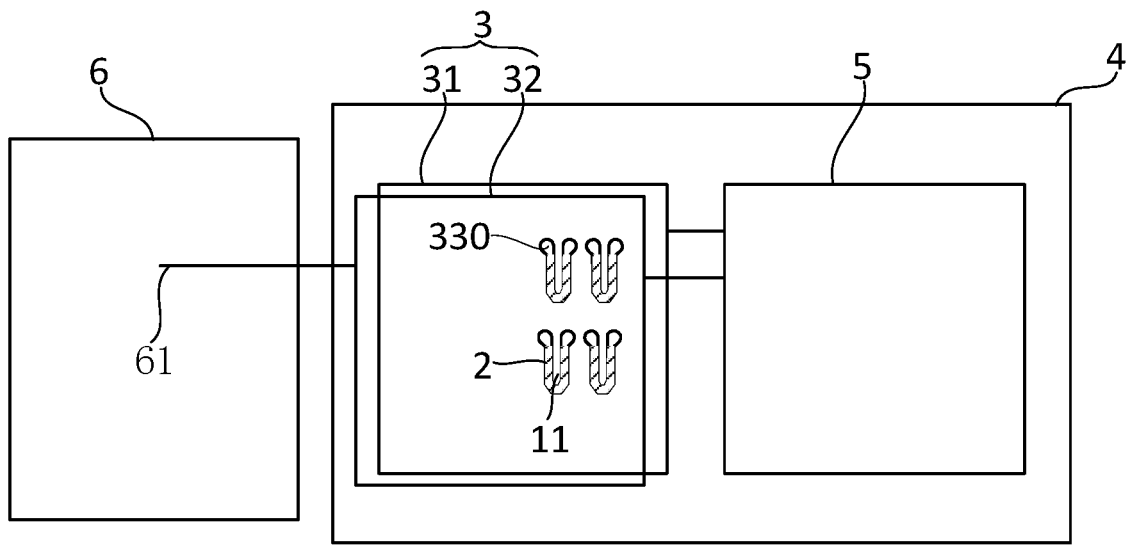
FIG. 12 is a partial structural schematic diagram of another array substrate provided by an embodiment of the present disclosure.

Optionally, in the above-mentioned GOA circuit provided by an embodiment of the present disclosure, as shown in FIG. 12, the first opening 2 included in the upper electrode 32 is a U-shaped opening 21, and second openings 330 are respectively formed in two parts, adjacent to the two top ends of the U-shaped opening 21, of the semiconductor layer 33 in the capacitor 3.

Specifically, electric charge easily can be accumulated at the two top ends of the U-shaped opening 21 and is possibly released from the top ends, resulting in difficult control of the discharge positions and directions. Specifically, by removing the semiconductor layer 33 at the two top ends of the U-shaped opening 21, a discharge path can be prevented at the two top ends, so as to achieve an effect of preventing the two top ends of the U-shaped opening 21 from discharging. By avoiding discharging at the two top ends of the U-shaped opening 21, more electric charge can be accumulated at and released from the tip structure 11 of the U-shaped opening 21, so as to better control the discharge positions and directions.

Optionally, in the above-mentioned GOA circuit provided by an embodiment of the present disclosure, the semiconductor layer can include an amorphous silicon layer (a-Si layer) and an n-type heavily-doped amorphous silicon layer (N+a-Si layer) which are overlapped sequentially, wherein the N+a-Si layer is adjacent to the upper electrode 32, a third opening is formed in the N+a-Si layer, and a projection of the third opening on the lower electrode 31 overlaps with a projection of the first opening 2 on the lower electrode 31. The N+a-Si layer has good electrical conductivity as an ohmic contact layer and the third opening is arranged on the N+a-Si layer. On the one hand, electrostatic charge can easily accumulate on the tip structure 11 of the upper electrode 32; on the other hand, the a-Si layer can be exposed through the third opening, so as to be beneficial to form the discharge path of the tip structure 11. In view of the two above-mentioned hands, discharge can more easily occur between the upper electrode 32 and the semiconductor layer 33, thus preventing the capacitor 3 from discharging to surrounding areas.

Optionally, in the above-mentioned GOA circuit provided by an embodiment of the present disclosure, the gate electrode, the source electrode and the drain electrode of the TFT 51 can be prepared from metal materials such as Cu, Al, Mo, Ti, Cr and W, or alloy of the materials.

The above-mentioned electrodes can be single-layer structures or multi-layer structures, e.g., a multi-layer Mo\Al\Mo composite structure, a multi-layer Ti\Cu\Ti composite structures, or a multi-layer Mo\Ti\Cu composite structures, etc. In other words, the upper electrode 32 and the lower electrode 31 of the capacitor 3 can be arranged according to the above-mentioned materials and structures.

Specifically, the gate insulation layer and the passivation layer of the TFT 51 can adopt silicon nitride or silicon oxide material; the gate insulation layer and the passivation layer can be single-layer structures or multi-layer structures, e.g., silicon oxide\silicon nitride composite structures. In other words, the first insulation layer 34 of the capacitor 3 and the second insulation layer 35 located on the capacitor 3 can be arranged according to the above-mentioned materials and structures.

Specifically, the active layer of the TFT 51 can adopt amorphous silicon, polycrystalline silicon, oxide (such as IGZO), or other types. In other words, the semiconductor layer of the capacitor 3 can be prepared from the above-mentioned active layer materials.

Exemplarily, with reference to FIG. 11 and FIG. 15, a preparation method of the above-mentioned GOA circuit provided by the present disclosure includes the following steps.

Step 101: a first metal layer is deposited on a substrate 30, and patterns of the lower electrode 31 of the capacitor 3 and the gate electrode G of the TFT 51 are formed in the GOA circuit 4 through a patterning process; and exemplarily, structures such as a gate line 61 of the display area 6 of an array substrate and a gate electrode of a TFT array on the display area 6 can also be formed in the patterning process.

Step 102: the first insulation layer 34 of the capacitor 3 and the gate insulation layer of the TFT 51 are formed; and exemplarily, a gate insulation layer structure of the TFT array on the display area 6 can also be formed in the patterning process.

Step 103: a semiconductor material layer, including an amorphous silicon layer (a-Si layer) and an n-type heavily-doped amorphous silicon layer (N+a-Si layer) is prepared, and a pattern of the semiconductor layer 33 in the capacitor 3 and a pattern of the active layer of the TFT 51 are formed through a patterning process Exemplarily, an active layer structure of the TFT array on the display area 6 can also be formed in the patterning process.

Step 104: a second metal layer is deposited, and patterns of the upper electrode 32 of the capacitor 3 and the source electrode S and the drain electrode D of the TFT 51 in the GOA circuit 4 are formed through a patterning process; and exemplarily, structures such as data lines as well as the source electrode and the drain electrode of the TFT array on the display area 6 can also be formed in the patterning process.

Step 105: the N+a-Si layer exposed through the first opening 2 in the upper electrode 32 of the capacitor 3 can be removed by using a plasma etching process to expose the a-Si layer.

Step 106: the second insulation layer 35 of the capacitor 3 and the passivation layer of the TFT 51 are formed; and exemplarily, a passivation layer structure of the TFT array on the display area 6 can also be formed in the patterning process.

Figure 10:
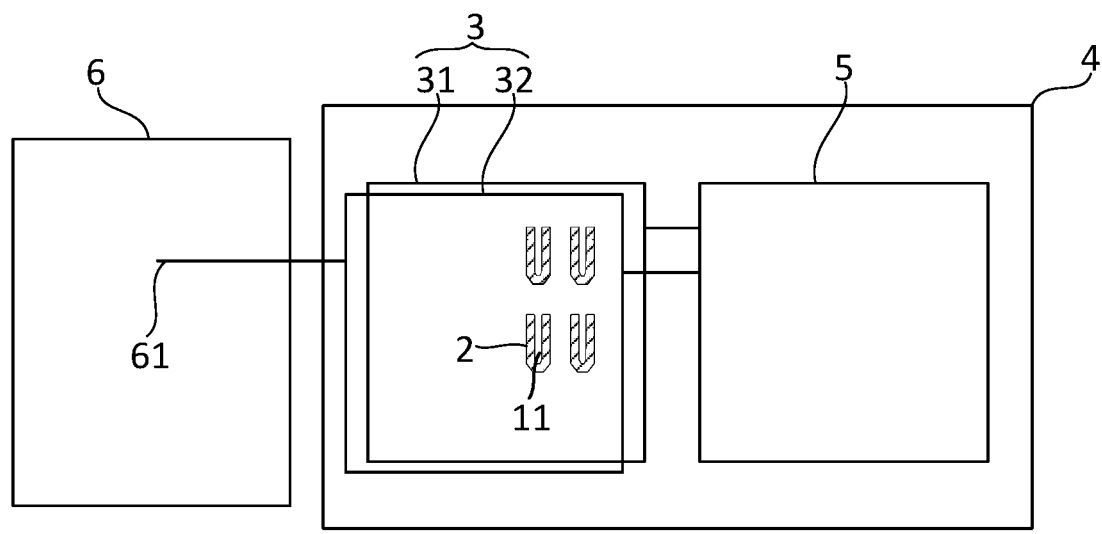
FIG. 10 is a partial structural schematic diagram of an array substrate provided by an embodiment of the present disclosure.

Optionally, in the above-mentioned GOA circuit provided by an embodiment of the present disclosure, as shown in FIGS. 10 to 12, in the GOA circuit 4 provided by the present disclosure, the upper electrode 32 of the capacitor 3 includes at least one first opening 2 formed on a side edge close to the TFT 51.

That is to say, at least one tip structure 11 is arranged at a position on the side edge, close to the TFT 51, of the upper electrode 32, so that electrostatic charge at the edge position is released timely, to avoid accumulating electrostatic charge at the edge and discharging to the surrounding areas, and further, effectively prevent the capacitor 3 from discharging to the TFT 51. Specifically, the orientation of the tip structure 11 is parallel to an extending direction of the side edge, close to the TFT 51, of the upper electrode 32, so that electrostatic charge is released along the extending direction of the side edge, so as to avoid discharging electrostatic charge to the direction of the surrounding TFT circuit 5, and prevent the TFT circuit 5 from being affected.

Optionally, a plurality of first openings 2 (tip structures 11) can be formed on the side edge, close to the TFT 51, of the upper electrode 32, so as to enhance an effect of guiding electrostatic discharge and improve a protection effect on the TFT circuit 5.

On the basis of the same inventive concept, an embodiment of the present disclosure also provides an array substrate, as shown in FIGS. 10 to 14, including the GOA circuits 4 according to any one of the above-mentioned embodiments, and gate lines 61 corresponding to the GOA circuits 4, wherein a gate line 61 is electrically connected with the upper electrode 32 of the capacitor 3 in a GOA circuit 4.

Specifically, the GOA circuits 4 correspond to the gate lines 61 one by one, and each gate line 61 is connected with the corresponding GOA circuit 4.

Figure 13:
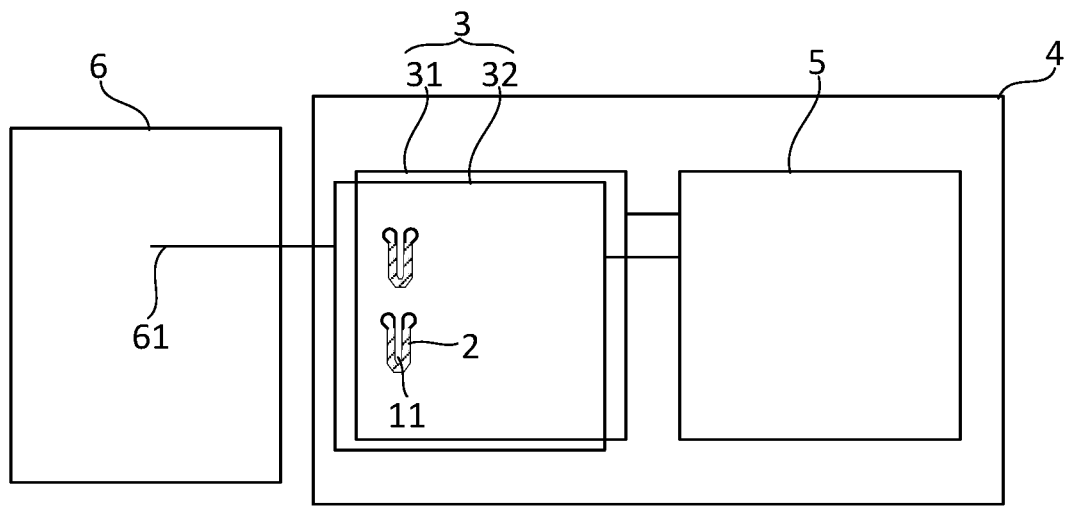
FIG. 13 is a partial structural schematic diagram of another array substrate provided by an embodiment of the present disclosure.

Optionally, in the above-mentioned array substrate provided by an embodiment of the present disclosure, as shown in FIG. 13, the upper electrode 32 of the capacitor 3 includes at least one first opening 2 formed on a side edge close to the gate line 61.

That is to say, at least one tip structure 11 can be arranged on the side edge, close to the display area 6, of the upper electrode 32, so that electrostatic charge at the edge position is released timely, to avoid accumulating electrostatic charge at the edge and discharging to the surrounding area, and effectively prevent the capacitor 3 from discharging to the display area 6. Specifically, the orientation of the tip structure 11 is parallel to the extending direction of the side edge, close to display area 6, of the upper electrode 32, so that electric charge is released along the extending direction of the side edge, so as to avoid discharging electric charge to the direction of the display area 6, and prevent the circuit of the display area 6 from being affected.

Exemplarily, a plurality of first openings 2 (tip structures 11) can be formed on the side edge, close to the TFT 51, of the upper electrode 32, to enhance the effect of guiding electrostatic discharge and improve the protection effect to the circuit in display area.

Figure 14:
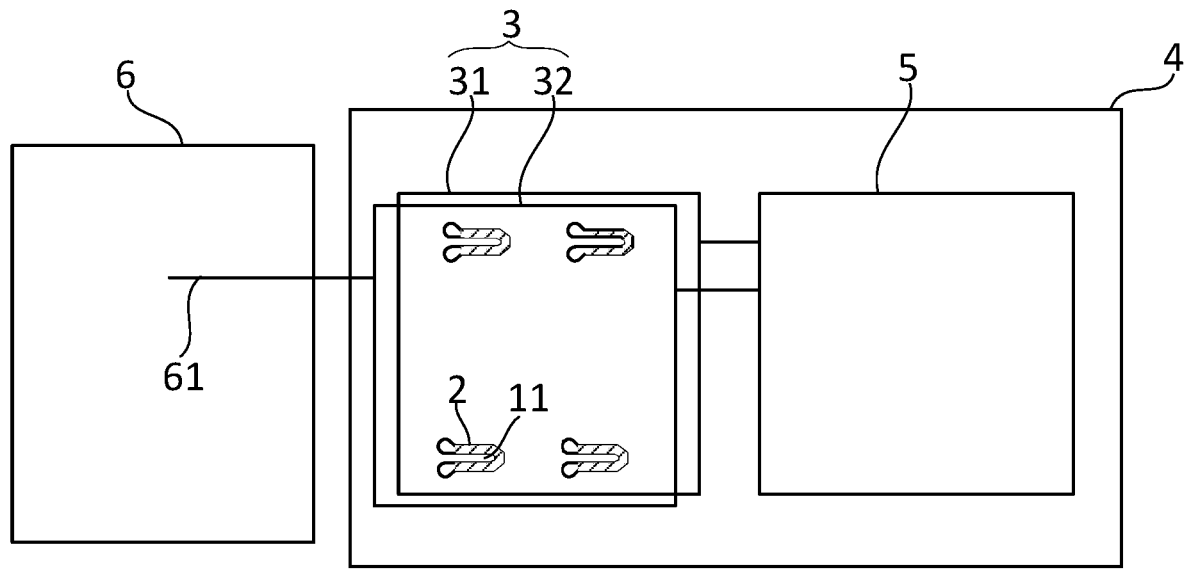
FIG. 14 is a partial structural schematic diagram of another array substrate provided by an embodiment of the present disclosure.

Of course, the tip structures 11 can also be arranged near other edges of the upper electrode 32. As shown in FIG. 14, the tip structures 11 can be arranged near upper and lower edges of the capacitor 3, so as to effectively prevent the capacitor 3 from discharging to circuits nearby the edges to improve the electrostatic protection effect on the circuit.

On the basis of the same inventive concept, an embodiment of the present disclosure also provides a display panel including the array substrate according to any one of the above-mentioned embodiments.

Specifically, the display panel can be a liquid crystal display (LCD) panel, in which a GOA circuit has a good electrostatic protection effect, so that damages of electric device cannot easily happen, and a preparation yield rate can be effectively increased, and a service life of the entire display panel can be effectively prolonged.

On the basis of the same inventive concept, an embodiment of the present disclosure also provides a display device including the above-mentioned display panel.

Specifically, the display device provided by the embodiment of the present disclosure is not limited to any specific type, and can be a television, a display, a laptop, etc.

It should be noted that the electrode structure, the capacitor structure, the specific implementations and application fields which are provided by the embodiments of the present disclosure are not limited to description of the above-mentioned embodiments, and these electric devices can also be applied in other fields related to electronics and electric equipment.

Obviously, without departing from the spirit and scope of the present disclosure, those skilled in the field can perform various changes and modifications on the embodiments of the present disclosure. In this way, if these changes and modifications of the present disclosure are within the scope of the claims of the present disclosure and equivalent technologies thereof, the present disclosure also intends to cover these changes and modifications.

What is claimed is:

1. An electrode structure, comprising:
a body; and
a first opening running through the body along a direction of a thickness of the body;
wherein the first opening has a half-enclosed shape in a cross section parallel to a plane where the body is arranged,
wherein the first opening is a U-shaped opening,
a part, enclosed by the U-shaped opening, of the body has a tip structure arranged toward a bottom of the U-shaped opening,
wherein a bulge part protruding toward the tip structure is arranged at a part, opposite to the tip structure, of the body; and
the bulge part has a smaller size than the tip structure.

2. The electrode structure according to claim 1, wherein the tip structure has a width smaller than 10 and has a length over 3 times of the width.

3. The electrode structure according to claim 1, the U-shaped opening is arranged close to an edge of the body, and
the opening orientation of the U-shaped opening is the same as an extending direction of the edge close to the U-shaped opening.

4. The electrode structure according to claim 1, wherein two top ends of the U-shaped opening are circular arcs.

5. The electrode structure according to claim 1, a distance between the tip structure and the bulge part is 4 μm-25 μm.

6. A capacitor, comprising:
an upper electrode and a lower electrode which are arranged oppositely;
wherein at least one of the upper electrode and the lower electrode has the electrode structure according to claim 1.

7. A gate on array (GOA) circuit, comprising:
a capacitor; and
a thin film transistor (TFT) circuit;
wherein an upper electrode and a lower electrode of the capacitor are electrically connected with the TFT circuit respectively; and
the upper electrode of the capacitor has the electrode structure according to claim 1.

8. The GOA circuit according to claim 7, wherein the capacitor further comprises a semiconductor layer arranged between the upper electrode and the lower electrode,
the semiconductor layer is adjacent to the upper electrode, and
the semiconductor layer is exposed under the first opening.

9. The GOA circuit according to claim 8, the first opening comprised in the upper electrode is a U-shaped opening, and
second openings are respectively formed in two top ends of the U-shaped opening.

10. The GOA circuit according to claim 8, wherein the TFT circuit comprises a TFT,
the lower electrode of the capacitor and a gate electrode of the TFT are electrically connected and prepared on a same layer,
the upper electrode of the capacitor and a drain electrode of the TFT are electrically connected and prepared on a same layer, and
the semiconductor layer of the capacitor and an active layer of the TFT are prepared on a same layer.

11. The GOA circuit according to claim 10, the semiconductor layer comprises an a-Si layer and an N+a Si layer which are overlapped sequentially,
the N+a-Si layer is adjacent to the upper electrode,
a third opening is formed in the N+a-Si layer, and
a projection of the third opening on the lower electrode overlaps with a projection of the first opening on the lower electrode.

12. The GOA circuit according to claim 10, wherein the upper electrode comprises at least one first opening formed on a side edge close to the TFT.

13. An array substrate, comprising:
the GOA circuit according to claim 7, and
a gate line corresponding to the GOA circuit;
wherein the gate line is electrically connected with the upper electrode of the capacitor in the GOA circuit.

14. The array substrate according to claim 13, wherein the upper electrode comprises at least one first opening formed on a side edge close to the gate line.

15. A display panel, comprising the array substrate according to claim 13.

16. A display device, comprising the display panel according to claim 15.

\* \* \* \* \*